(12) United States Patent
Mao et al.

(10) Patent No.: US 7,910,961 B2
(45) Date of Patent: Mar. 22, 2011

(54) IMAGE SENSOR WITH LOW CROSSTALK AND HIGH RED SENSITIVITY

(75) Inventors: Duli Mao, Sunnyvale, CA (US); Vincent Venezia, Sunnyvale, CA (US); Hsin-Chih Tai, Cupertino, CA (US); Yin Qian, Milpitas, CA (US); Howard E. Rhodes, San Martin, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 324 days.

(21) Appl. No.: 12/247,776

(22) Filed: Oct. 8, 2008

(65) Prior Publication Data

US 2010/0084692 A1 Apr. 8, 2010

(51) Int. Cl.
*H01L 29/78* (2006.01)
*H01L 31/0232* (2006.01)

(52) U.S. Cl. .................................................. 257/258

(58) Field of Classification Search ............ 257/219, 257/225, 239, E27.133–E27.134, 240, 241, 257/E27.082–E27.083, E27.15–E27.163, 257/233, 292, 431–466, E31.127, E29.255, 257/E29.065, E29.227, E29.24, 223, 228, 257/245–447, 229
See application file for complete search history.

(56) References Cited

U.S. PATENT DOCUMENTS

| | | | |
|---|---|---|---|
| 7,388,187 B1 | 6/2008 | Liu et al. | |
| 7,531,857 B2 * | 5/2009 | Park | 257/291 |
| 7,687,875 B2 * | 3/2010 | Lee | 257/462 |
| 2001/0054726 A1 * | 12/2001 | Abe | 257/292 |
| 2004/0094783 A1 | 5/2004 | Hong | |
| 2006/0163618 A1 * | 7/2006 | Park | 257/221 |
| 2006/0186316 A1 * | 8/2006 | Miyashita et al. | 250/208.1 |
| 2006/0208289 A1 * | 9/2006 | Ohkawa et al. | 257/291 |
| 2007/0075338 A1 | 4/2007 | Park et al. | |
| 2007/0097227 A1 * | 5/2007 | Toyokawa | 348/222.1 |
| 2007/0210397 A1 * | 9/2007 | Omi et al. | 257/431 |
| 2008/0087922 A1 | 4/2008 | Hynecek | |
| 2008/0135896 A1 * | 6/2008 | Fan et al. | 257/292 |
| 2009/0108385 A1 | 4/2009 | Dungan et al. | |

FOREIGN PATENT DOCUMENTS

| EP | 0 605 898 A1 | 7/1994 |
|---|---|---|
| EP | 1 744 366 A1 | 1/2007 |

OTHER PUBLICATIONS

PCT/US2009/054080, PCT International Search Report and Written Opinion of the International Searching Authority, mailed Dec. 2, 2009, 14 pages.

* cited by examiner

*Primary Examiner* — Dao H Nguyen
*Assistant Examiner* — Tram H Nguyen
(74) *Attorney, Agent, or Firm* — Blakely Sokoloff Taylor & Zafman LLP

(57) ABSTRACT

A color pixel array includes first, second, and third pluralities of color pixels each including a photosensitive region disposed within a first semiconductor layer. In one embodiment, a second semiconductor layer including deep dopant regions is disposed below the first semiconductor layer. The deep dopant regions each reside below a corresponding one of the first plurality of color pixels but substantially not below the second and third pluralities of color pixels. In one embodiment, buried wells are disposed beneath the second and third pluralities of color pixels but substantially not below the first plurality of color pixels.

11 Claims, 6 Drawing Sheets

IMAGE SENSOR WITH LOW CROSSTALK AND HIGH RED SENSITIVITY

TECHNICAL FIELD

This disclosure relates generally to image sensors, and in particular but not exclusively, relates to CMOS image sensors with low crosstalk and high red sensitivity.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

Crosstalk is a serious problem in image sensors. There are three components to crosstalk: a) optical crosstalk, b) spectral crosstalk, and c) electrical crosstalk. Optical crosstalk is caused by the diffraction and/or scattering of light off of metal lines and at interfaces between the dielectric layers within the metal stack that overlays a CIS array. Spectral crosstalk results from the finite (nonzero) transmittance of color filters to wavelengths outside their target pass band, such as the finite transmittance of green and blue wavelengths through a red filter.

One form of electrical crosstalk is lateral drift of photo-generated charge carriers created deep in the semiconductor epitaxial layers (e.g., photogenerated electrons). As these photo-generated charge carriers rise, they can drift laterally and end up collected in the photodiode ("PD") region of a neighboring pixel. Blooming is another form of electrical crosstalk characterized by the lateral diffusion of charge carriers when a PD region becomes full or saturated with charge carriers. Blooming is most commonly experienced in high luminous environments. Photo carriers that are generated near a saturated PD region will not be collected and therefore remain free to diffuse laterally into a neighboring pixel. Blooming results in the blurring of edges in still images and streaking in moving images. Both forms of electrical crosstalk are due to charge carriers generated in one pixel being collected by a neighboring pixel.

FIG. 1 illustrates a conventional CIS array 100 including three color pixels (red, green, and blue) that are susceptible to electrical crosstalk. Each PD region 105 of CIS array 100 is composed of a three-dimensional p-n junction having an N doped silicon middle surrounded by P doped silicon. Photons impinging on the PD regions 105 are absorbed in the silicon, creating photo-generated electron-hole pairs. Electron-hole pairs generated in the depletion region of the p-n junctions are separated effectively and the electrons are collected in the N type region for subsequent transfer through a transfer transistor during signal read out. However, electron-hole pairs generated outside of the depletion region are not separated as effectively and have a higher chance of diffusing to neighboring pixels, leading to reduced sensitivity and higher crosstalk. This phenomenon is more pronounced for small pixel sizes.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and system for CMOS image sensor ("CIS") having low crosstalk and high red sensitivity are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
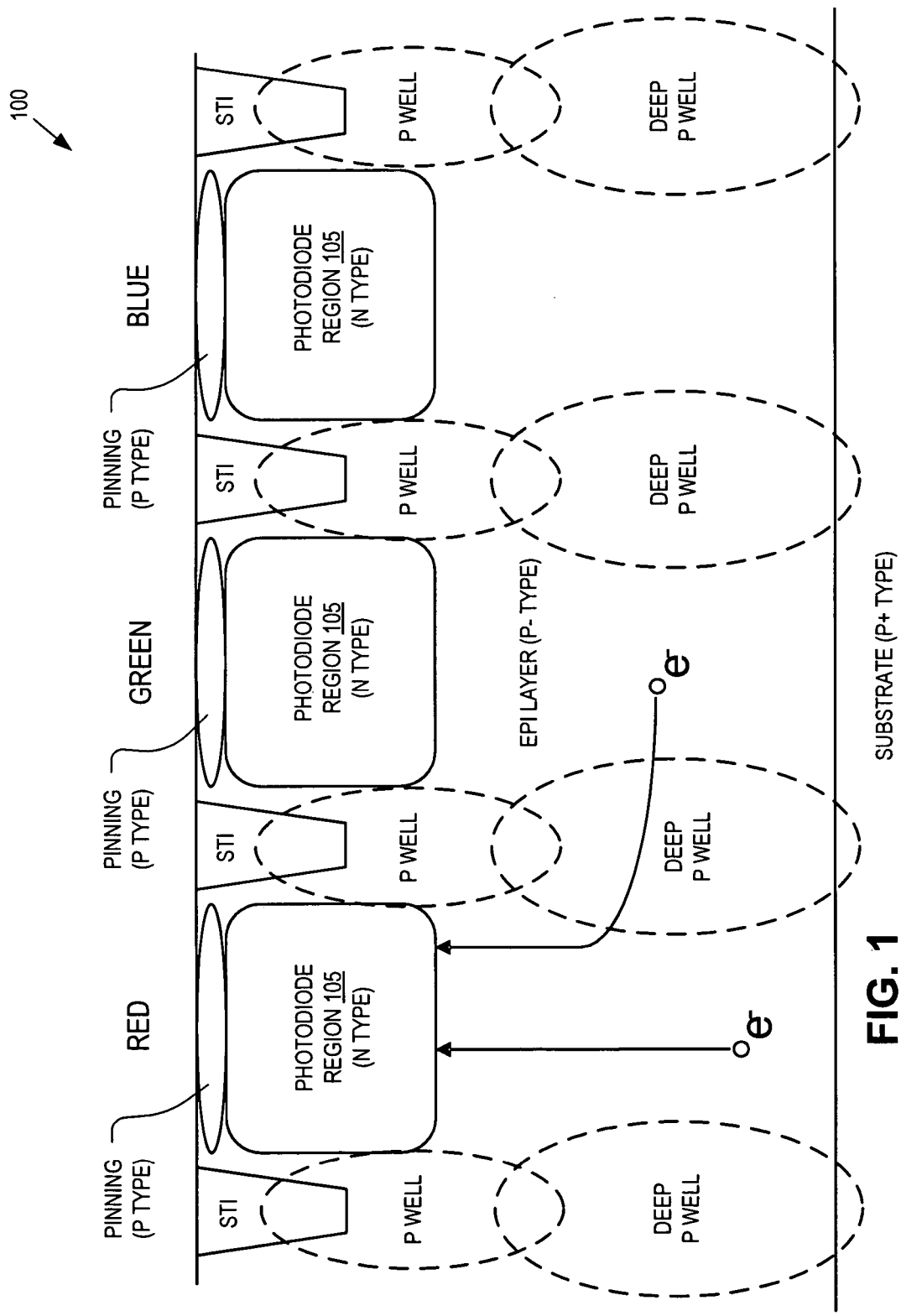
FIG. 1 (PRIOR ART) is a cross-sectional view of a portion of three adjacent color pixels of a conventional CMOS image sensor ("CIS") array.
Figure 2:
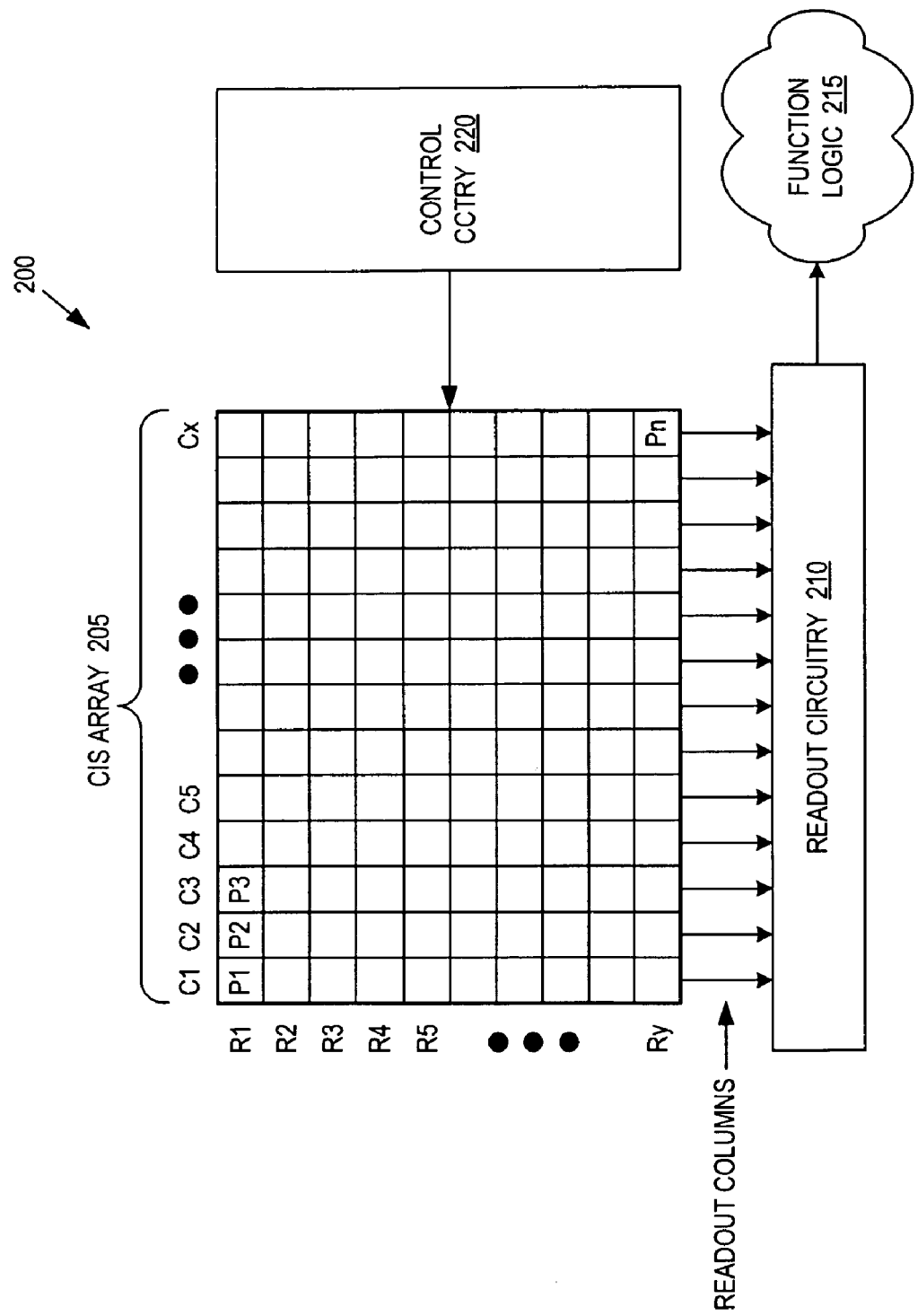
FIG. 2 is a functional block diagram illustrating an imaging system, in accordance with an embodiment of the invention.

FIG. 2 is a functional block diagram illustrating an imaging system 200, in accordance with an embodiment of the invention. The illustrated embodiment of imaging system 200 includes a CIS array 205 having low crosstalk and high red sensitivity, readout circuitry 210, function logic 215, and control circuitry 220.

CIS array 205 is a two-dimensional ("2D") array of image sensors or pixels (e.g., pixels P1, P2 . . . , Pn). In one embodiment, each pixel is a front side illuminated complementary metal-oxide-semiconductor ("CMOS") imaging pixel. CIS array 205 includes a color filter pattern, such as a Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data via an image processor by applying post image effects (e.g., image compression, crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a column readout, a serial readout, or a full parallel readout of all pixels simultaneously.

Control circuitry 220 is coupled to CIS array 205 to control operational characteristic of CIS array 205. For example, control circuitry 220 may generate a shutter signal for controlling image acquisition. In one embodiment, the shutter signal is a global shutter signal for simultaneously enabling all pixels within CIS array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
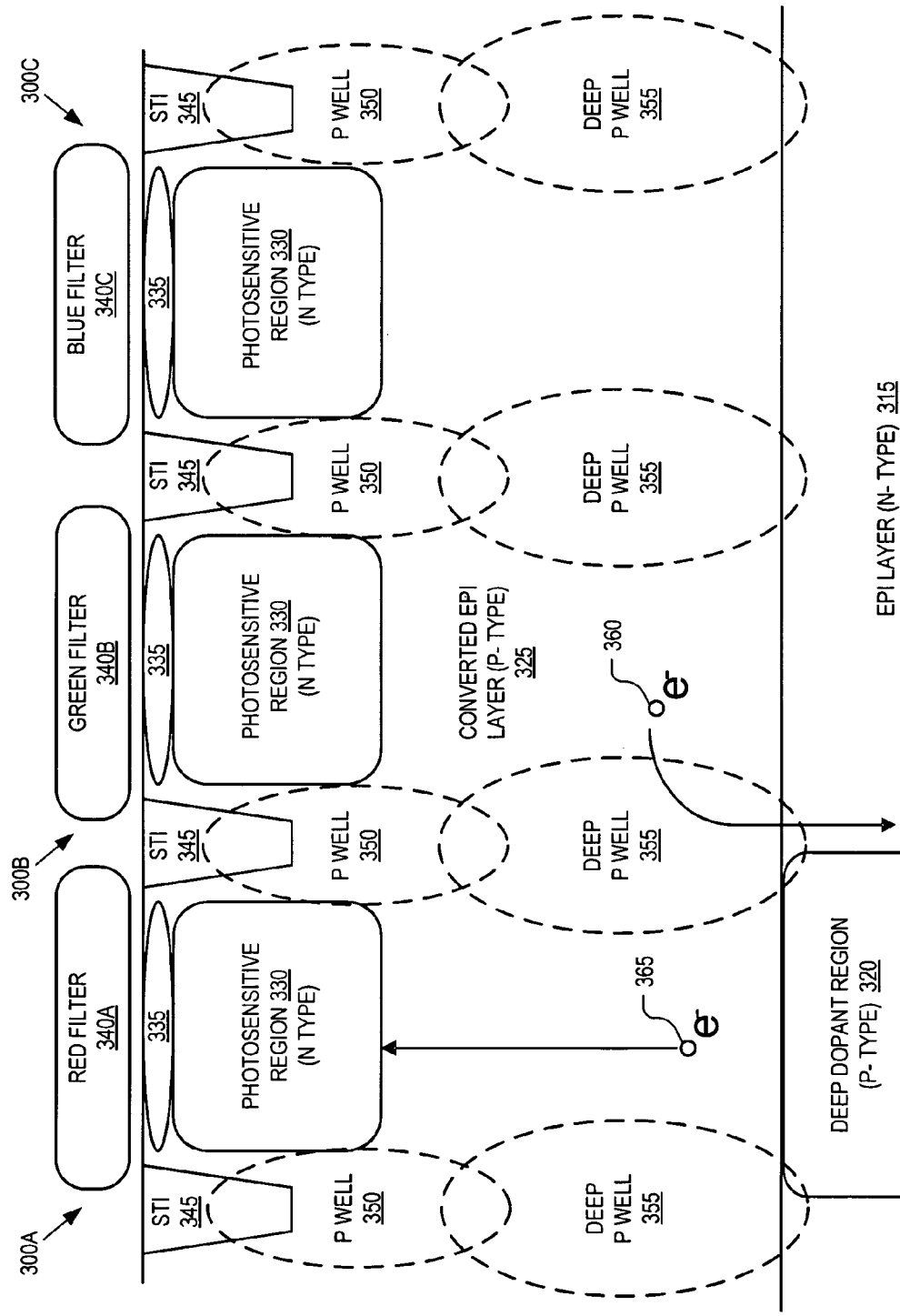
FIG. 3 is a cross-sectional view of a portion of three adjacent color pixels of a CIS array having low crosstalk and high red sensitivity, in accordance with a first embodiment of the invention.

FIG. 3 is a cross-sectional view of a portion of three adjacent color pixels 300 within a CIS array having low crosstalk and high red sensitivity, in accordance with a first embodiment of the invention. The color pixels 300 (e.g., red pixel 300A, green pixel 300B, and blue pixel 300C) represent one possible implementation of the pixels illustrated in FIG. 2. The illustrated portion of the CIS array includes a substrate 310, an epitaxial ("epi") layer 315, a deep dopant region 320, a converted epi layer 325, photosensitive regions 330, pinning layers 335, color filters 340 (e.g., red filter 340A, green filter 340B, and blue filter 340C), shallow trench isolations ("STI") 345, p wells 350, and deep p wells 355.

In the illustrated embodiment, substrate 310 is highly doped N type silicon. On top of substrate 310, lighter N doped epitaxial layer 315 is formed. Over epi layer 315 is a P type epi layer 325. In one embodiment, epi layer 325 is initially grown as a part of N type epi layer 315 and then converted to a P type epi layer via appropriate P type doping. Pixels 300 include N type photosensitive regions 330 disposed within P type converted epi layer 325 to generate p-n junction photodiodes for each pixel 300. In some embodiments, P type pinning layers 335 are formed over the top of photosensitive regions 330 to passivate the surface and reduce surface defects. Color filters 340 are disposed over the top of pixels 300 in a pattern (e.g., Bayer mosaic) to create a color filter array and designate each pixel 300 as a red, green, or blue pixel (magenta, yellow, or cyan in the case of a CMY color filter array). In one embodiment, color filters 340 are fabricated of a pigmented polymer material. Often, color filters 340 are fabricated above a metal stack (not illustrated) for routing signal lines over the top of CIS array 205, but under an array of microlenses (not illustrated) for focusing light through apertures in the metal stack onto photosensitive regions 330.

The illustrated portion of color pixels 300 are electrically isolated from each other with STI 345, P wells 350, and deep P wells 355. P wells 350 and deep P wells 355 generate potential barriers to deter lateral migration of photo-generated charge carriers between adjacent pixels. In one embodiment, P wells 350 and deep P wells 355 are P doped regions having a higher doping concentration than the surrounding converted epi layer 325.

FIG. 3 illustrates a doping arrangement for a CIS array having N type epi layer 315 disposed on an N type substrate 310. The N type substrate 310 and epi layer 315 help prevent crosstalk by attracting and trapping photo-generated charge carriers (e.g., charge carrier 360) generated deep within converted epi layer 325 before they have a chance to migrate into surrounding pixels. In one embodiment, epi layer 315 is approximately 1-5 μm thick.

Photons having longer wavelengths tend to penetrate deeper into converted epi layer 325 generating electron-hole pairs closer to N type epi layer 315 than their shorter wavelength counterparts. As such, the presence of N type epi layer 315 can result in a decrease in sensitivity to longer wavelengths, since these deep photo-generated charge carriers have an increased likelihood of being pulled down into N type epi layer 315 than collected into photosensitive regions 330. Accordingly, deep dopant region 320 is disposed below those pixels configured for capturing longer wavelength light (e.g., red or magenta pixels for visible spectrum image sensors). Deep dopant region 320 is doped to have the same dopant type as converted epi layer 325 (e.g., both P type doped). In effect, deep dopant region 320 extends the depth of converted epi layer 325 underneath red pixel 300A, thereby increasing the sensitivity of red pixel 300A. Deep dopant region 320 decreases the likelihood deep charge carriers (e.g., charge carrier 365) created within red pixel 300A will be pulled down into N type epi layer 315. However, should these deep charge carrier drift laterally towards an adjacent pixel, past the edges of deep dopant region 320, they stand an increased chance of recombining in epi layer 315, as opposed to erroneously being captured by green pixel 300B or blue pixel 300C. In one embodiment, deep dopant region 320 is approximately 1 μm thick.

Figure 4:
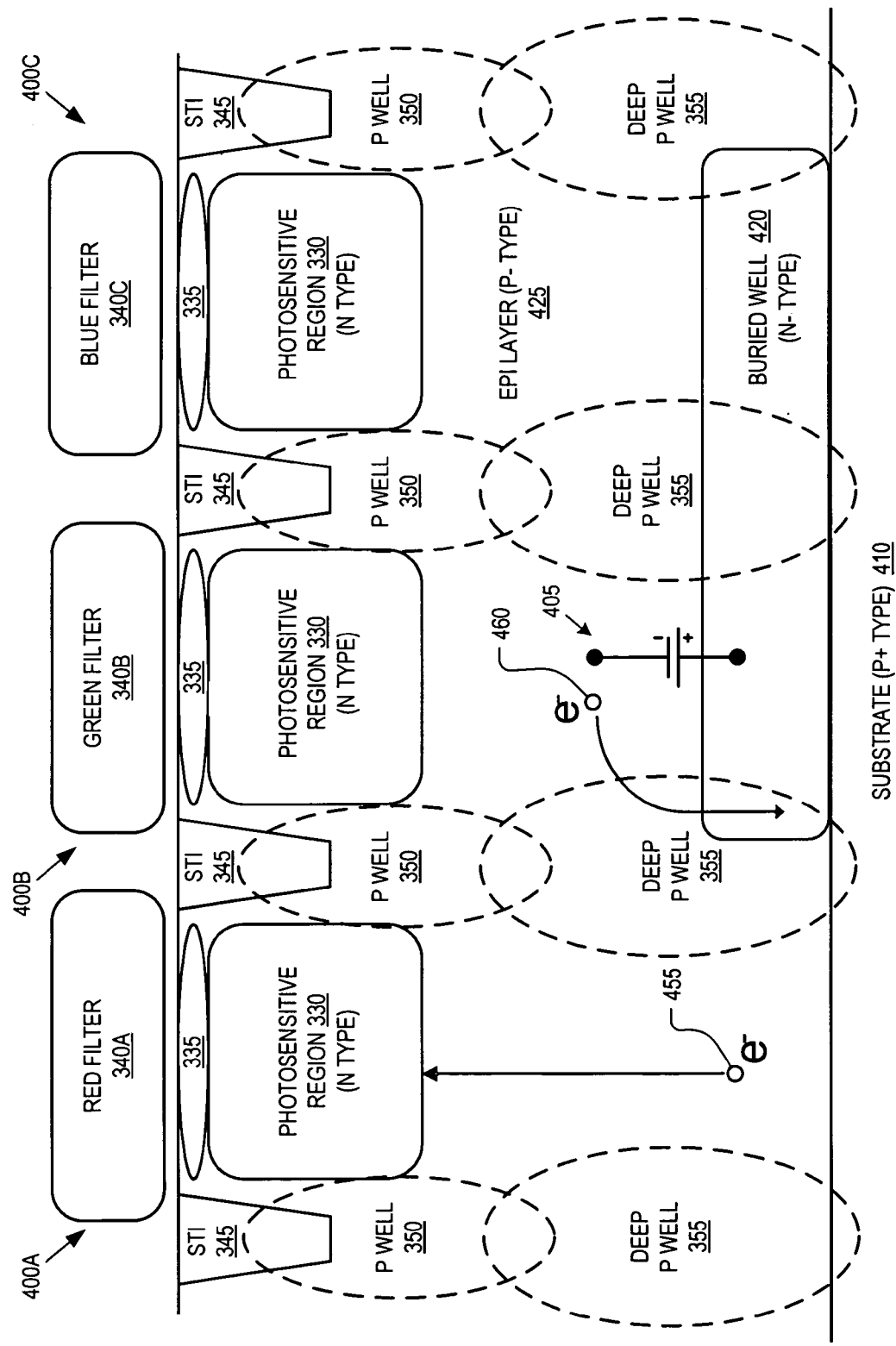
FIG. 4 is a cross-sectional view of a portion of three adjacent color pixels of a CIS array having low crosstalk and high red sensitivity, in accordance with a second embodiment of the invention.

FIG. 4 is a cross-sectional view of a portion of three adjacent color pixels 400 within a CIS array having low crosstalk and high red sensitivity, in accordance with a second embodiment of the invention. The color pixels 400 (e.g., red pixel 400A, green pixel 400B, and blue pixel 400C) represent another possible implementation of the pixels illustrated in FIG. 2. Pixels 400 are similar to pixels 300 with the following exceptions: substrate 410 is P type, instead of extending the P type region under the red pixel into an N type substrate with deep dopant region 320, a buried well 420 is positioned under the shorter wavelength pixels (e.g., green pixel 400B and blue pixel 400C) to prevent lateral migration of deep charge carriers 460 into adjacent pixels.

Color pixels 400 reduce crosstalk by shortening the depth of epi layer 425 under green pixels 400B and blue pixels 400C with buried wells 420 while preserving high red sensitivity by retaining greater thickness of epi layer 425 under red pixels 400A. Signal collection in red pixels 400A is the same as a typical image sensor without buried well 420. Electrons 455 photo-generated deep in red pixel 400A are pushed toward the surface by the gradient P type doping formed from thermal diffusion of dopants from highly doped P+ substrate 410 into the lower dopant concentration region of P− epi layer 425.

In one embodiment, buried well 420 is fabricated via the addition of an N type implant process. During this N type implant process, red pixels 400A are masked. In one embodiment, implant energies are controlled to create buried well 420 located approximately 2-5 μm below the Silicon surface.

Additionally, in one embodiment, buried well 420 is positively biased relative to epi layer 425 with biasing circuit 405 (e.g., Vdd positive bias such as 2.8V or 3.3V). Application of a positive bias between buried well 420 and epi layer 425 provides additional attraction of deep charge carriers 460 into buried well 420 to further hinder electrical crosstalk between adjacent pixels 400.

Figure 5:
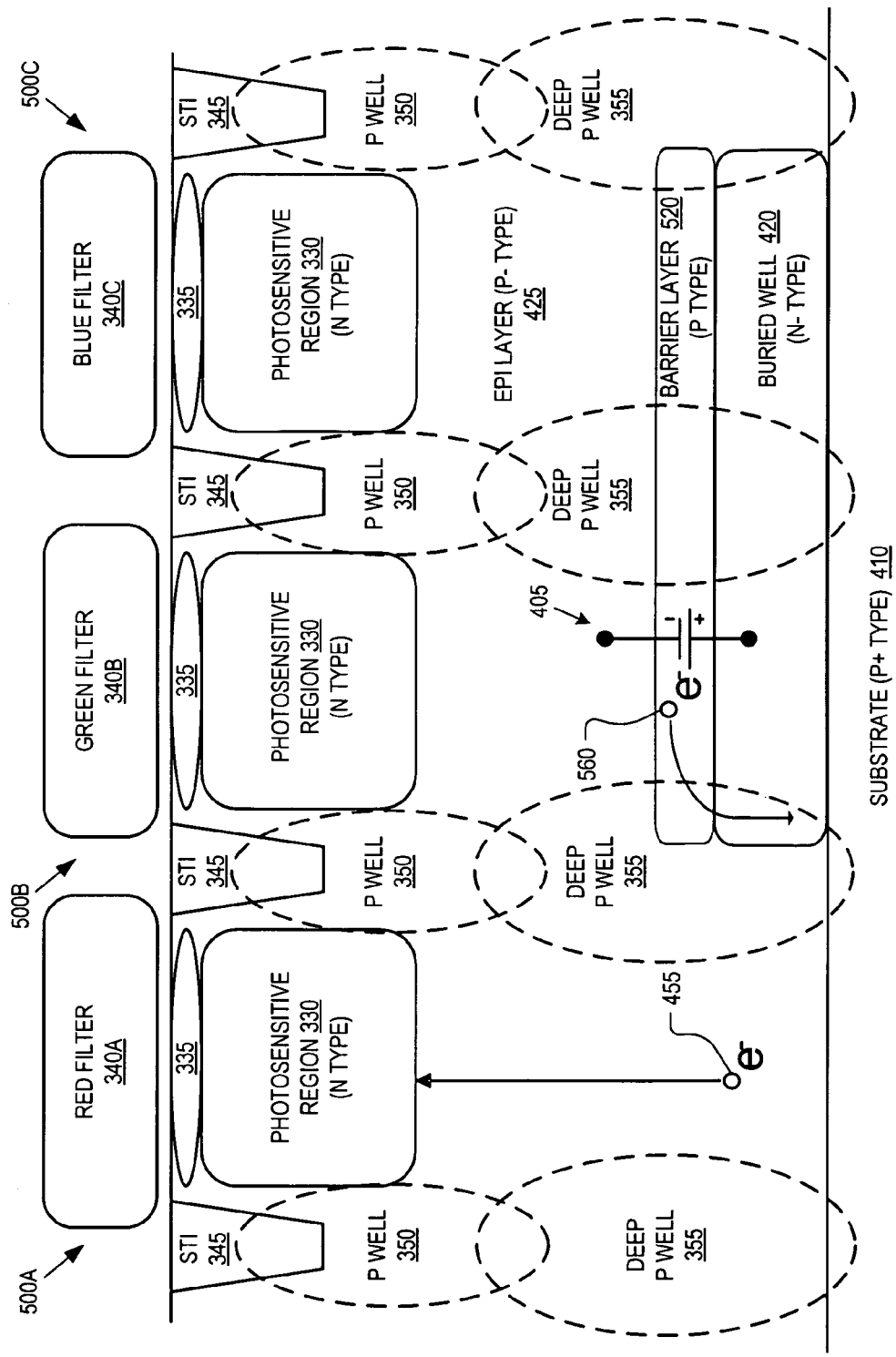
FIG. 5 is a cross-sectional view of a portion of three adjacent color pixels of a CIS array having low crosstalk and high red sensitivity, in accordance with a third embodiment of the invention.

FIG. 5 is a cross-sectional view of a portion of three adjacent color pixels 500 within a CIS array having low crosstalk and high red sensitivity, in accordance with a third embodiment of the invention. The color pixels 500 (e.g., red pixel 500A, green pixel 500B, and blue pixel 500C) represent another possible implementation of the pixels illustrated in FIG. 2. Pixels 500 are similar to pixels 400 except for the addition of a barrier layer 520 overlaying buried well 420. Again, in some embodiments, biasing circuit 405 may apply an additional positive bias between buried well 420 and epi layer 425.

Barrier layer 520 improves the sensitivity of the green and blue pixels by creating a graded P type doping under these pixels above buried well 420. Barrier layer 520 reduces the extent of the depletion region formed between the buried well 420 and the P type epi layer 425 above it by increasing the doping concentration of the silicon immediately adjacent to buried well 420. Reducing the extent of the depletion region increases the depth of the signal collection region beneath photosensitive regions 330 within green pixel 500B and blue pixel 500C. Furthermore, the P type dopant gradient profile repels photo-generated electrons generated immediately above barrier layer 520 into its photosensitive region 330, while deeply generated photo-generated electrons 560 are still pulled into buried well 420 to inhibit lateral migration and electrical crosstalk.

In one embodiment, barrier layer 520 is implanted immediately before or after implantation of buried well 420. Since red pixels 500A are already masked off from the implantation of buried well 420, no additional mask layer is necessary over the fabrication of pixels 400. Fabrication of buried well 420 and barrier layer 520 may occur before gate oxide deposition and photosensitive regions 330 are implanted, but after STI 345 formation. Of course, other fabrication strategies may also be employed. In one embodiment, barrier layer 520 is approximately 1 μm thick while buried well 420 is approximately 2 μm thick and the overall thickness of epi layer 425 between the top of substrate 410 and the top of STI's 345 is approximately 5 μm thick.

It should be appreciated that various elements of CIS array 205 have been excluded from FIGS. 3, 4, and 5 above so as not to crowd the illustrations. For example, the CIS arrays illustrated in FIGS. 3, 4, and 5 do not illustrate the pixel circuitry (e.g., transfer transistor, reset transistor, source-follower transistor, or row select transistor), the front side metal stack and inter-metal dielectric layers, microlens, or other elements commonly found in a CIS array. Furthermore, the components of the CIS arrays illustrated in FIGS. 3, 4, and 5 are not necessarily drawn to scale or actual shape; rather, are merely intended to be representative so as to convey the concepts of the illustrated embodiments. Correspondingly, deep dopant region 320 is illustrated in FIG. 3 as residing substantially beneath photosensitive region 330 of red pixel 300A; however, it should be appreciated that the term "substantially" includes minor variations such as deep dopant region 320 residing under only a portion of photosensitive region 330 within red pixel 300A or partially extending under surrounding STI 345 and even partially extending under the edges of adjacent green or blue pixels. The same applies to buried wells 420 and barrier layers 520 in that while FIGS. 4 and 5 illustrates these elements residing substantially under green and blue pixels, the term "substantially" in this context includes minor variations where these elements do not reside under the entire green and blue pixels or partially extend under adjacent red pixels.

Figure 6:
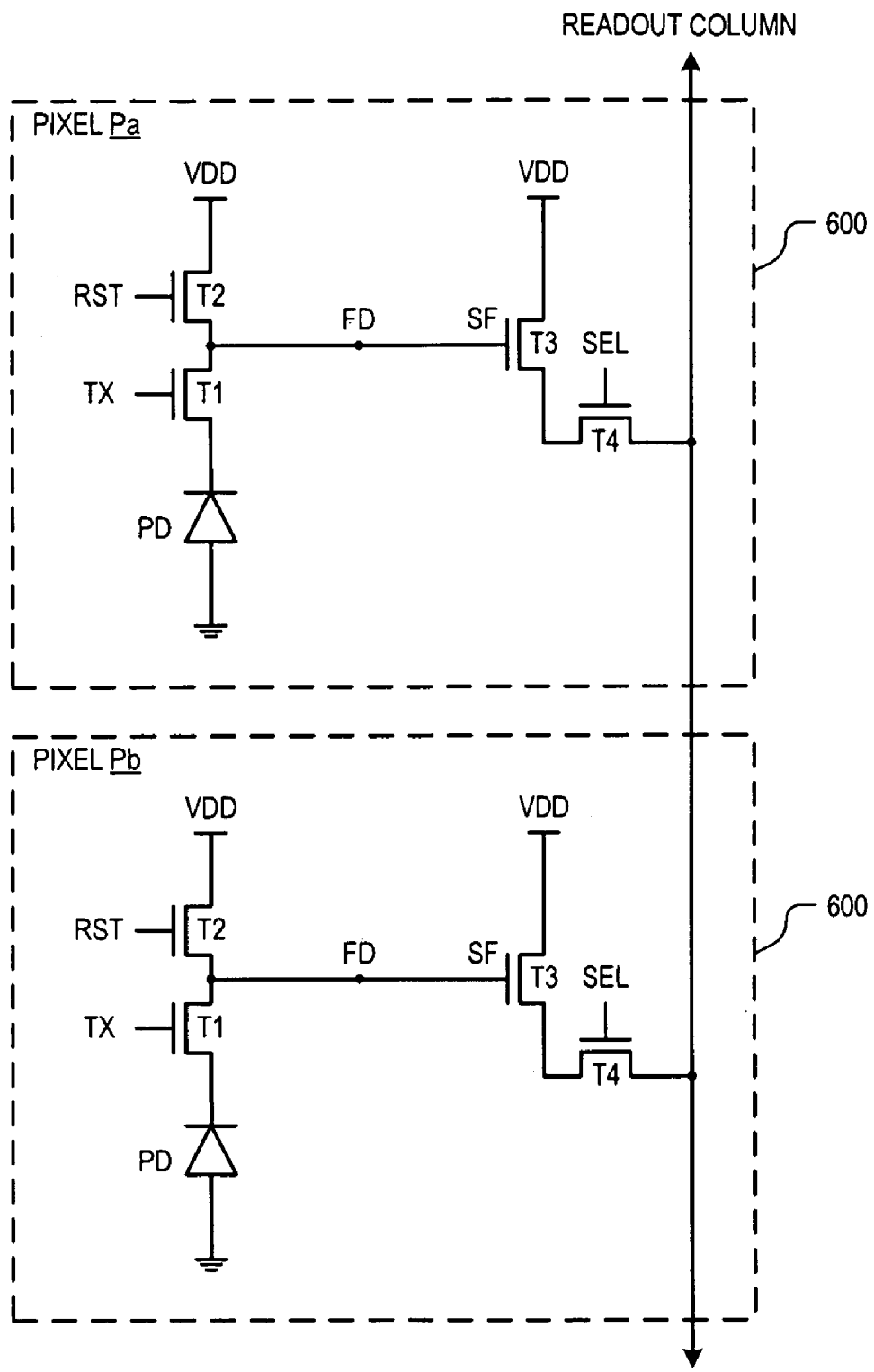
FIG. 6 is a circuit diagram illustrating sample pixel circuitry of two pixels within a CIS array, in accordance with an embodiment of the invention.

FIG. 6 is a circuit diagram illustrating pixel circuitry 600 of two four-transistor ("4T") pixels within an image sensor array, in accordance with an embodiment of the invention. Pixel circuitry 600 is one possible pixel circuitry architecture for implementing each pixel within CIS array 205 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 6, pixels Pa and Pb are arranged in two rows and one column. The illustrated embodiment of each pixel circuitry 600 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 700 to the readout column line under control of a select signal SEL.

In one embodiment, the TX signal, the RST signal, and the SEL signal are generated by control circuitry 220. In an embodiment where CIS array 205 operates with a global shutter, the global shutter signal is coupled to the gate of each transfer transistor T1 in the entire image sensor array 205 to simultaneously commence charge transfer from each pixel's photodiode PD. Alternatively, rolling shutter signals may be applied to groups of transfer transistors T1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color pixel array, comprising:
   first, second, and third pluralities of color pixels each including a photosensitive region disposed within a semiconductor layer; and
   buried wells disposed within the semiconductor layer and extending beneath the photosensitive regions of the second and third pluralities of color pixels but substantially not extending below the photosensitive region of the first plurality of color pixels to hinder lateral charge carrier migration out of the second and third pluralities of color pixels,
   wherein the first plurality of color pixels comprises a first group of the color pixels having a first color, the second plurality of color pixels comprises a second group of the color pixels having a second color, and the third plurality of color pixels comprises a third group of the color pixels having a third color, wherein the first, second, and third colors are different colors, wherein the first plurality of color pixels comprises red or magenta pixels while the second and third pluralities of color pixels comprise any of green, blue, cyan, or yellow pixels, wherein each of the buried wells extends under at least two of the colored pixels.

2. The color pixel array of claim 1, wherein the buried wells have a same dopant type as the photosensitive regions and an opposite dopant type as the semiconductor layer.

3. The color pixel array of claim 1, further comprising:
a substrate layer disposed below the semiconductor layer, wherein the semiconductor layer comprises an epitaxial layer.

4. The color pixel array of claim 3, wherein a first distance from a bottom of the photosensitive regions to the substrate layer is greater than a second distance between the bottom of the photosensitive regions and a top of the buried wells.

5. The color pixel array of claim 1, further comprising a barrier layer disposed above each of the buried wells, the barrier layer having a doping type opposite that of the buried wells, wherein the barrier layer has a same doping type as the semiconductor layer, but with a higher concentration than the semiconductor layer.

6. The color pixel array of claim 5, wherein the barrier layers do not substantially extend under the first plurality of color pixels.

7. The color pixel array of claim 1, wherein the first plurality of color pixels comprise pixels configured to capture photo-generated carriers generated by photons having longer wavelengths than the second and third pluralities of color pixels are configured to capture.

8. The color pixel array of claim 1, further comprising a biasing circuit coupled to positively bias voltage the semiconductor layer relative to the buried wells.

9. An imaging system, comprising:
a complementary metal-oxide-semiconductor ("CMOS") image array including:
first, second, and third pluralities of color pixels each including a photodiode disposed within an epitaxial layer to capture image data; and
buried wells disposed within the epitaxial layer and extending beneath the photodiode of the second and third pluralities of color pixels but substantially not extending below the photodiode of the first plurality of color pixels,
wherein the first plurality of color pixels comprises a first group of the color pixels having a first color, the second plurality of color pixels comprises a second group of the color pixels having a second color, and the third plurality of color pixels comprises a third group of the color pixels having a third color, wherein the first, second, and third colors are different colors,
wherein the first plurality of color pixels comprises red or magenta pixels while the second and third pluralities of color pixels comprise any of green, blue, cyan, or yellow pixels,
wherein each of the buried wells extends under at least two of the colored pixels; and
readout circuitry coupled to the CMOS image array to readout the image data from each of the color pixels.

10. The imaging system of claim 9, wherein the first plurality of color pixels comprise pixels configured to capture photo-generated carriers generated by photons having longer wavelengths than the second and third pluralities of color pixels are configured to capture.

11. The imaging system of claim 10, wherein the CMOS image array further includes a barrier layer disposed above each of the buried wells, the barrier layer having a doping type opposite that of the buried wells, wherein the barrier layer has a same doping type as the epitaxial layer, but with a higher concentration than the epitaxial layer.

* * * * *